(12) United States Patent
Celant et al.

(10) Patent No.: US 6,466,097 B1
(45) Date of Patent: Oct. 15, 2002

(54) PHASE LOCKED LOOP AND ASSOCIATED CONTROL METHOD

(75) Inventors: Luca Celant, Milan; Marco Demicheli, Binago; Melchiorre Bruccoleri, Rho; Daniele Ottini, Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/421,643

(22) Filed: Oct. 20, 1999

(51) Int. Cl.⁷ ................................................ H03L 7/06
(52) U.S. Cl. .......................... 331/17; 327/536; 327/157
(58) Field of Search ............................ 331/17; 327/536, 327/157

(56) References Cited

U.S. PATENT DOCUMENTS 5,736,880 A    4/1998    Bruccoleri et al.

OTHER PUBLICATIONS

"Differential Charge Pump", IBM Technical Disclosure Bulletin, vol. 33, No. 9, Feb. 1, 1991, pp. 332–333, XP000109567.

I.I. Novof et al., "Fully Integrated CMOS Phase–Locked Loop with 15 to 240 MHz Locking Range and ±50ps Jitter", IEEE Journal of Solid–State Circuits, vol. 30, No. 11, Nov. 1995, pp. 1259–1266. XP000553064.

B. Thompson et al., A 300–MHz BiCMOS Serial Data Transceiver, IEEE Journal of Solid State Circuits, vol. 29, No. 3, Mar. 1994, pp. 185–192, XP000452105.

European Search Report for Application No. EP 98 83 0300, dated Oct. 12, 1998.

*Primary Examiner*—Arnold Kinkead
(74) *Attorney, Agent, or Firm*—Lisa K. Jorgenson; Stephen Bongini; Fleit, Kain, Gibbons, Gutman & Bongini P.L.

(57) ABSTRACT

A phase locked loop is provided that includes a phase comparator, a charge pump circuit, a loop filter, and a voltage controlled oscillator. The charge pump circuit includes two symmetric branches, feedback paths, and circuit breaking switches. Each of the symmetric branches has a constant current generator and a pulsed current generator, with one terminal of the loop filter being connected to one of the symmetric branches and the other terminal of the loop filter being connected to the other of the symmetric branches. The feedback paths control the constant current generators based on voltages at the terminals of the loop filter, and each of the circuit breaking switches couple one of the pulsed current generators and the corresponding terminal of the loop filter. The pulsed current generators supply a first current whose amplitude is proportional to an amplitude of a second current supplied by the constant current generators through the duty cycle of the first current. In a preferred embodiment, the circuit breaking switches are controlled by phase error signals from the phase comparator. A method for controlling a charge pump circuit in a phase locked loop is also provided.

24 Claims, 4 Drawing Sheets

PHASE LOCKED LOOP AND ASSOCIATED CONTROL METHOD

BACKGROUND OF THE INVENTION

1. Field of the Invention

The present invention relates to electronic circuits, and more specifically to a phase locked loop circuit having a phase comparator, a charge pump, a loop filter, and a voltage controlled oscillator.

2. Description of Related Art

In electronic circuits, it is often required to generate a highly precise reference frequency whose value is programmable for various purposes. For example, read and write channels for hard disk drives (i.e., the magnetic disks operating as mass storage for a processor) require a circuit to generate a programmable reference frequency to maintain at constant density the data stored on the magnetic disk. This function is commonly obtained through the use of phase locked loop (PLL) circuits that generate a wide range of frequencies, which can be set through the selection of the division value of two dividers, from a high precision fixed clock signal.

FIG. 1 shows a block diagram of a conventional phase locked loop 1. The phase locked loop 1 includes a phase comparator 2, a charge pump circuit 3, a filter loop 4, and a voltage controlled oscillator 5 that are connected in series on a main branch of the phase locked loop 1. A feedback branch departs from the voltage controlled oscillator 5 receiving an output frequency signal FOUT at a frequency divider block 6, which divides by an integer number M. The divided frequency signal FD is sent to the input of the phase comparator 2, which also receives a reference frequency signal FR.

The phase comparator 2 detects the phase difference between the divided frequency signal FD and the reference frequency signal FR and issues two signals UP and DOWN, which are representative of the phase error or displacement and whose trend is shown in FIG. 2. Signals UP and DOWN consist of pulses whose length difference is proportional to the phase displacement between the divided frequency signal FD and the reference frequency signal FR. As shown in FIG. 2, the signal UP is used to pull the signal DOWN to the low logic state (i.e., to drive its falling edge). The signal DOWN is pulled to the high logic state where it remains for a time proportional to the phase displacement, then the signal UP is generated, which remains at the high logic level only for the time required by the logic gates to drive the falling edge of both signals UP and DOWN.

The phase comparator 2, which is also known as a sequential phase comparator, is particularly suited for those applications where input signals also initially differ in their frequencies. Under steady conditions or when the divided frequency signal FD and the reference frequency signal FR are in phase, pulses are at their minimum length and have an equal length. Both signals UP and DOWN drive the charge pump circuit 3 that converts them into current pulses IU and ID. Current pulses IU and ID are then transformed into control voltage displacements V1 and V2 for the voltage controlled oscillator through the loop filter 4, which is a balanced filter RC that will be described below with reference to FIG. 4.

The control voltages displacements V1 and V2 produce a change in the oscillating frequency of the voltage controlled oscillator 5 (i.e., the frequency of the output signal FOUT) that is proportional to the phase difference between the divided frequency signal FD and the reference frequency signal FR detected by the phase comparator 2. Thus, the phase locked loop 1 in steady state will reach a condition where the rising edges or falling edges of the divided frequency signal FD and reference frequency signal FR are phase aligned (i.e., the phase error between them is zero).

FIG. 3 shows a conventional charge pump circuit having current generators connected between the filter terminals and supply lines and ground. As shown, the charge pump circuit 3 includes two fixed current generators I1 and I2 located between a supply voltage VDD and one of two nodes N1 and N2, respectively. The nodes N1 and N2 represent the terminals of the loop filter 4. Two further switching current generators I3 and I4 are connected between ground GND and nodes N1 and N2 through two switches S3 and S4, respectively. Fixed current generators I1 and I2 are always operating so as to determine a constant current injection on nodes N1 and N2. Switches S3 and S4, which are respectively driven by the signals UP and DOWN that are representative of the phase error, determine the connection between nodes N1 and N2 and the switching current generators I3 and I4 as follows.

In a first configuration, switching current generators I3 and I4 are connected with node N2, whereas node N1 only receives the current supplied by fixed current generator I1. In a second configuration, switching current generators I3 and I4 are connected with node N1, whereas node N2 only receives the current supplied by fixed current generator I2. The loop filter 4 carries out an integrating operation so that voltage displacement is established on nodes N1 and N2, which correspond to control voltages V1 and V2 of the voltage controlled oscillator 5.

Moreover, a feedback path is provided to lead back control voltages V1 and V2 and drive the current output of fixed current generators I1 and I2. Thus, the conmnon mode voltage related to nodes N1 and N2 is maintained constant. The charge pump circuit 3 substantially provides two symmetric branches, each one of which has a constant current generator and a pulsed current generator that inject their currents in the nodes common to the filter and to the differential inputs of the voltage controlled oscillator. For this reason, the charge pump circuit 3 can also be considered as having two differential branches.

FIG. 4 shows the loop filter 4. This is a balanced filter RC having a series connected resistor R and first capacitor C1 connected in parallel with a second capacitor C2. An equivalent resistor REQ is shown in parallel with loop filter 4 to represent the series resistance of fixed current generators I1 and I2. The loop filter 4 is especially relevant because it determines the dynamics of the phase locked loop 1, and consequently its performance.

The conventional charge pump circuit described above has drawbacks. First, because two current generators are always connected in parallel with the filter and these current generators do not have an infinite resistance, a current flow will result between the input filter nodes with an ensuing undesired voltage displacement between the two points controlling the voltage controlled oscillator. As a result, the output signal from the phase locked loop is affected by a phase offset that cannot be removed from the reaction loop and consequently there is a frequency output differing from that which is desired.

A further drawback of the charge pump circuit of FIG. 3 arises because the switching current generators and switches are provided as a sole circuit having a differential pair of P-channel MOS transistors that operate both as switches and current generators. The use of P-channel MOS transistors causes problems due to their slow speed and the difficulty of providing two symmetric P-channel transistors.

SUMMARY OF THE INVENTION

In view of these drawbacks, it is an object of the present invention to overcome the above-mentioned drawbacks and to provide an improved phase locked loop.

Another object of the present invention is to provide a phase locked loop with a charge pump circuit that does not cause input voltage displacements at the voltage controlled oscillator so as to provide a substantially zero phase offset.

A further object of the present invention is to provide a phase locked loop having a charge pump circuit with a substantially infinite impedance with respect to the filter.

Yet another object of the present invention is to provide a phase locked loop having switching current generators with a high parameter symmetry and that are not substantially affected by any changes in technological process parameters.

One embodiment of the present invention provides a phase locked loop that includes a phase comparator, a charge pump circuit, a loop filter, and a voltage controlled oscillator. The charge pump circuit includes two symmetric branches, feedback paths, and circuit breaking switches. Each of the symmetric branches has a constant current generator and a pulsed current generator, with one terminal of the loop filter being connected to one of the symmetric branches and the other terminal of the loop filter being connected to the other of the symmetric branches. The feedback paths control the constant current generators based on voltages at the terminals of the loop filter, and each of the circuit breaking switches couple one of the pulsed current generators and the corresponding terminal of the loop filter. The pulsed current generators supply a first current whose amplitude is proportional to an amplitude of a second current supplied by the constant current generators through the duty cycle of the first current. In a preferred embodiment, the circuit breaking switches are controlled by phase error signals from the phase comparator.

Another embodiment of the present invention provides a method for controlling a charge pump circuit in a phase locked loop having a phase comparator that supplies phase error signals to the charge pump circuit. The charge pump circuit converting the phase error signals into current signals integrated by a loop filter to drive a voltage controlled oscillator, and has two symmetric branches each including a constant current generator and a pulsed current generator. According to the method, the constant current generators are controlled through feedback paths that maintain a constant common mode voltage on the two terminals of the loop filter, and each pulsed current generator is connected with the corresponding terminal of the loop filter after a transition of a corresponding one of the phase error signals. The constant current generators are sized to supply a first current with a first current amplitude substantially proportional to a second amplitude of a second current that is supplied by the pulsed current generators through the ratio of a period of the phase error signals to a time interval during which each of the phase error signals is active.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 3:
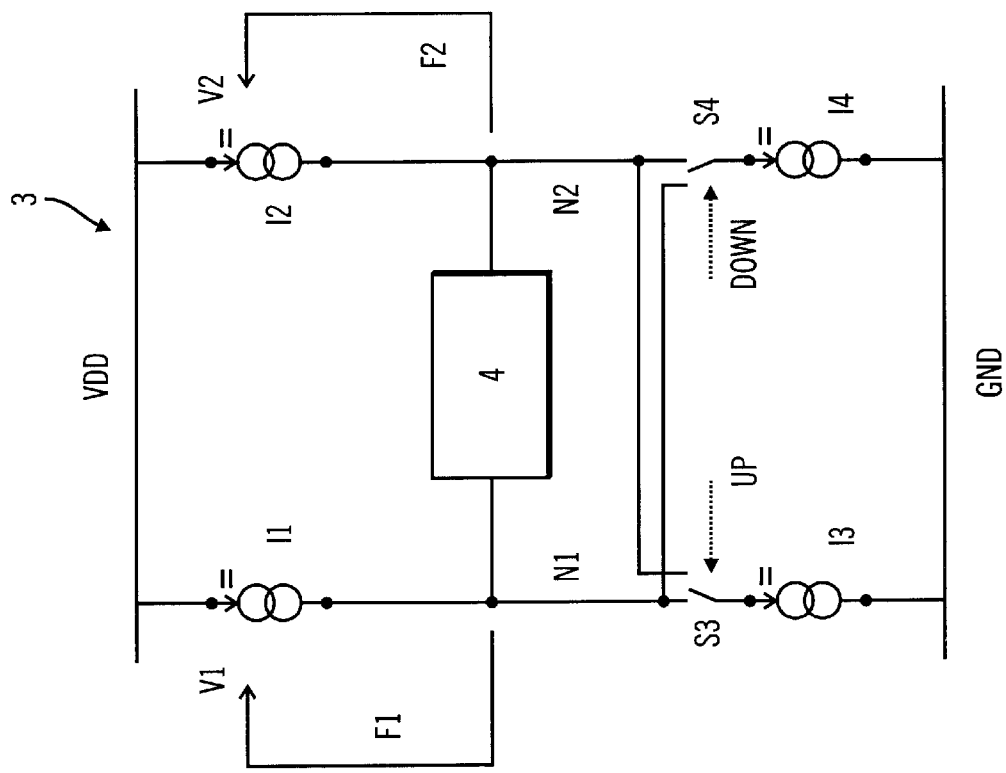
FIG. 3 shows a schematic diagram of one portion of the phase locked loop of FIG. 1.
Figure 5:
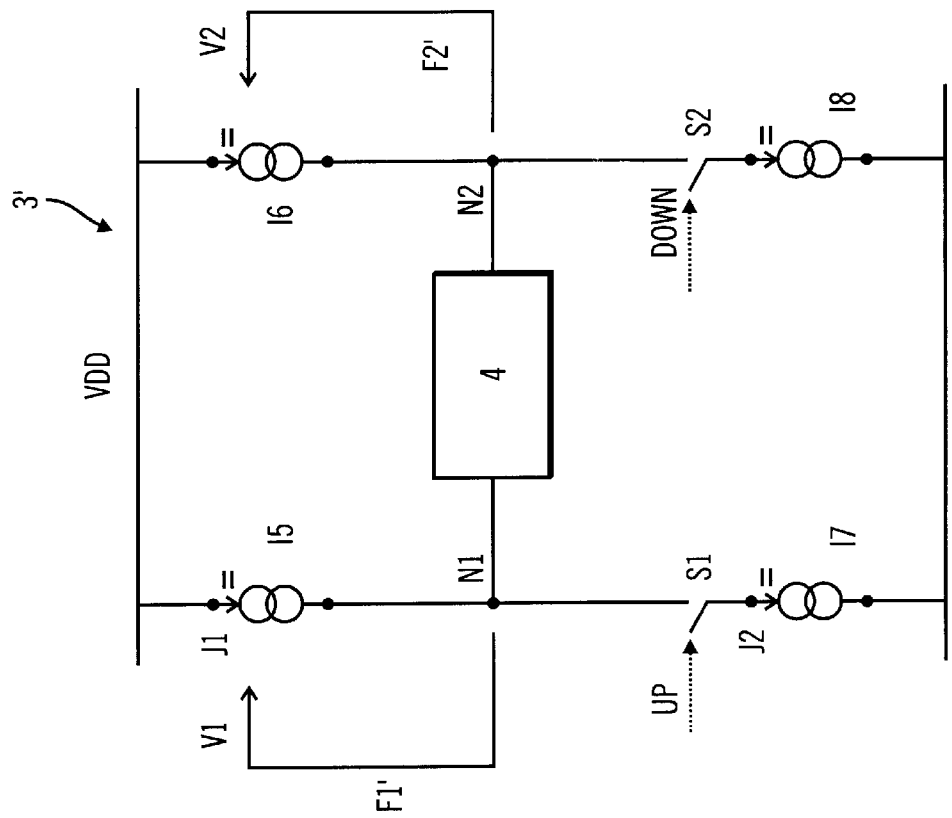
FIG. 5 shows a schematic diagram of a portion of a phase locked loop according to a preferred embodiment of the present invention.

FIG. 5 shows a charge pump circuit 3' according to a preferred embodiment of the present invention. The charge pump circuit 3' of FIG. 3 has the filter loop 4 connected between nodes N1 and N2. A voltage driven current generator I5 is provided between node N1 and the supply line VDD. Another voltage driven current generator I6 is provided between node N2 and the supply line VDD. The driving voltage consists of voltages V1 and V2 available on nodes N1 and N2 and led back through respective feedback paths F1' and F2'. Thus, when driving the voltage driven current generators I5 and I6, a feedback control of the common mode voltage is achieved on nodes N1 and N2 of the loop filter 4.

A switched current generator I7 is connected between node N1 and ground GND. Moreover, a switch S1, which is controlle[0084] by the signal UP, is connected between node N1 and switched current generator I7. Similarly, another switched current generator I8 is connected between node N2 and ground GND. Moreover, a switch S2, which is controlled by the signal DOWN, is connected between node N2 and switched current generator I8. To maintain a constant common mode voltage related to nodes N1 and N2, the integral of the constant current J1 supplied by voltage driven current generator I5 or I6 should be equal and of opposite sign to the integral of a pulsed current J2 supplied by switched current generator I7 or I8. This is because the constant current J1 and the pulsed current J2 are integrated by the capacity represented by capacitor C2 of the loop filter 4.

Figure 6:
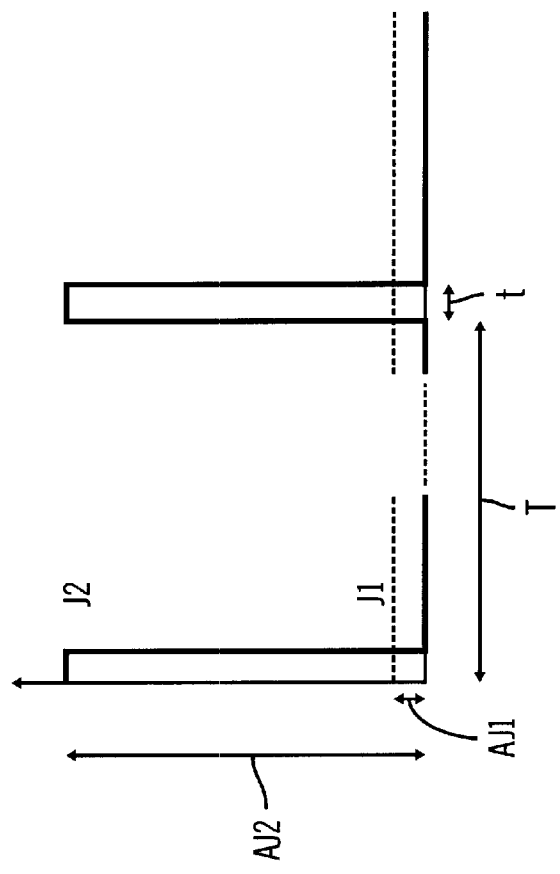
FIG. 6 shows a diagram of waveforms generated by the circuit of FIG. 5.

Therefore, in order to control the constant current J1 through the voltage to nodes N1 and N2 and to maintain a constant common mode voltage in the charge pump circuit 3' (having switches S1 and S2 instead of switches S3 and S4), voltage driven current generators I5 and I6 have to supply a very low value constant current J1. FIG. 6 shows the resulting trend of the constant current J1 and pulsed current J2. The amplitude AJ1 of the constant current J1 with respect to the amplitude AJ2 of the pulsed current J2 is given by the following equation.

$$AJ1 = AJ2 \times t/T$$

where T is the period of the signals UP and DOWN, and t is the time during which the signals UP and DOWN are at the high level (i.e., t/T represents the duty cycle of pulsed current J2).

As explained below with respect to FIG. 7, the pulsed current amplitude AJ2 is typically 5 µA, the period T is 200 ns, and the period t is 1 ns, so that current amplitude AJ1 will be 25 nA. The voltage driven current generators I5 and I6 are formed using MOS transistors. Because they have to supply such a low current, they can be sized to provide a very high resistance with respect to nodes N1 and N2. Thus, the generators introduce a virtually zero phase offset.

Figure 1:
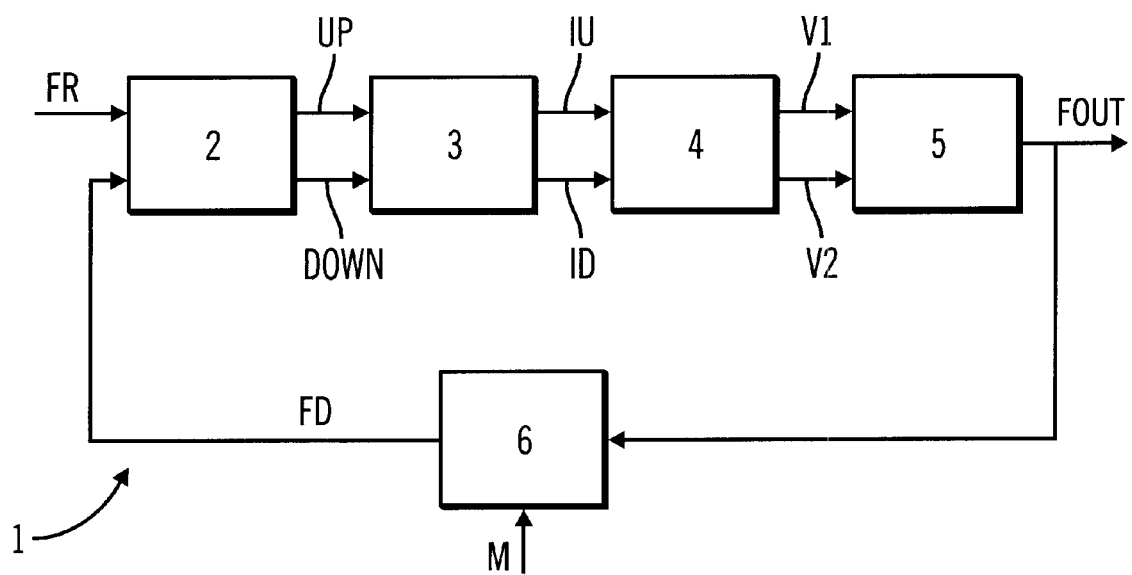
FIG. 1 shows a block diagram of a conventional phase locked loop.
Figure 4:
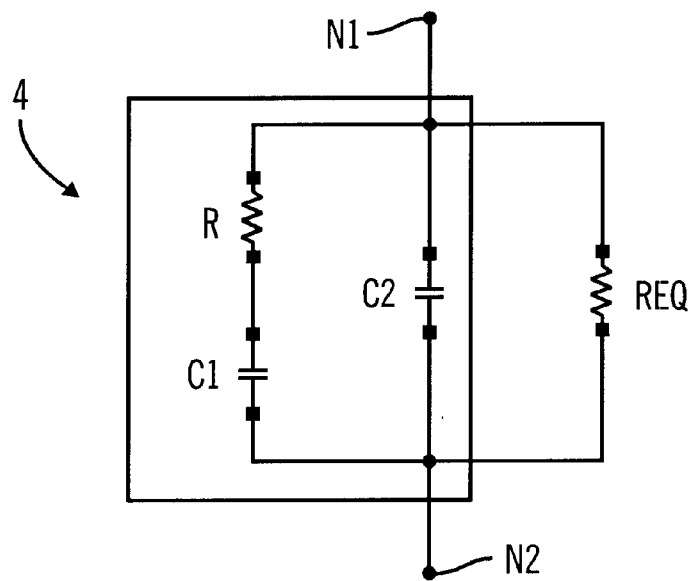
FIG. 4 shows a schematic diagram of a second portion of the phase locked loop of FIG. 1.
Figure 2:
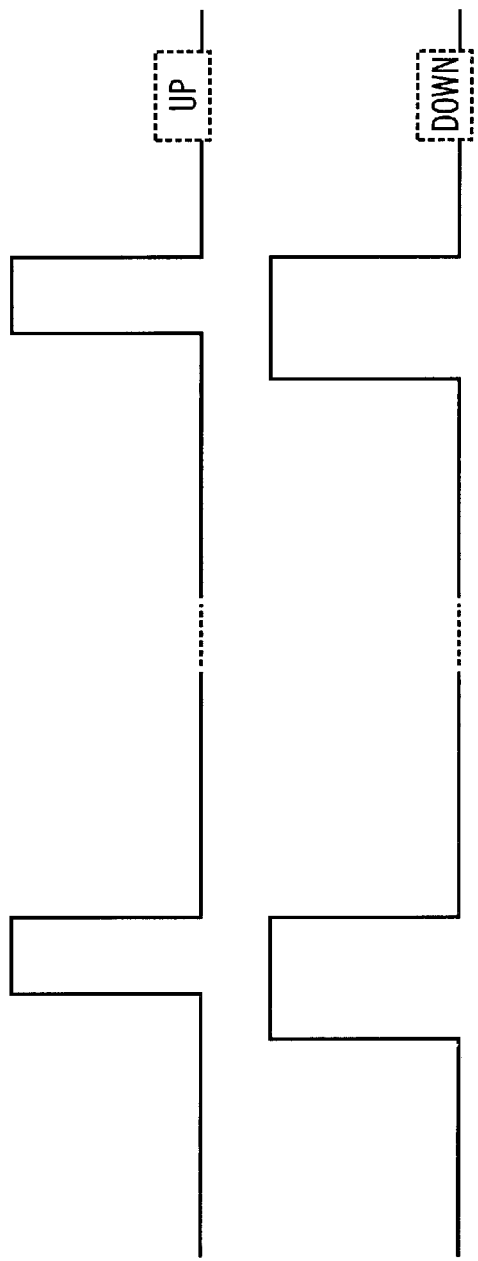
FIG. 2 shows a timing diagram of two signals generated by the phase locked loop of FIG. 1.
Figure 7:
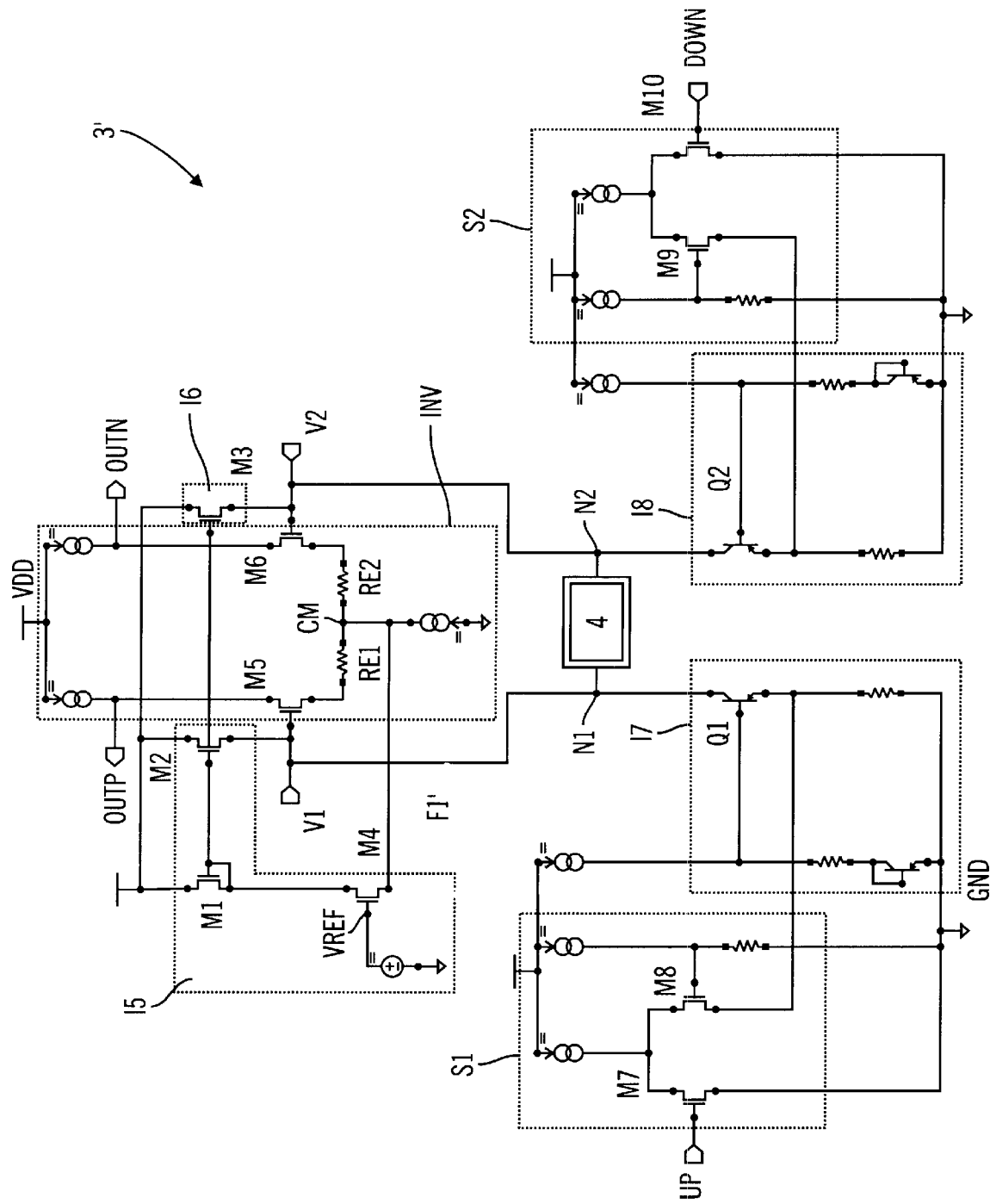
FIG. 7 shows one exemplary embodiment for the circuit of FIG. 5.

FIG. 7 shows one exemplary embodiment for the charge pump circuit 3' of FIG. 4 that is based on BiCMOS technology. The charge pump circuit 3' is connected with the loop filter 4 and with an input stage INV of the voltage controlled oscillator 5. The input stage INV is substantially a transconductance amplifier. Voltage controlled current generator I5 is provided by a P-channel MOS type transistor M2. Voltage controlled current generator I6 is provided by a P-channel MOS type transistor M3. Transistors M2 and M3 are connected in parallel with a transistor M1 in a current mirror configuration.

Input stage INV is provided by a differential pair of two P-channel MOS type transistors M5 and M6, with differential output signals OUTP and OUTN respectively provided on their drain electrodes. Since output signals OUTP and OUTN are outputs of a transconductance amplifier, these signals are in the form of currents. Transistor M1 is connected with the common source electrodes of transistors M5 and M6 through a transistor M4, which is controlled by a reference direct voltage VREF. Transistor M4 has its source electrode connected with the input stage INV at a node CM that is common for the source electrodes of transistors M5 and M6 through respective resistors RE1 and RE2.

This is where the common mode voltage of input stage INV is available. As a result, the source voltage of transistor M4 is proportional to the common mode voltage related to nodes N1 and N2 wherefrom it is modulated, and modulates the current of the mirrors that include both transistors M2 and M3. Therefore, there is a first feedback path F1' formed by transistor M5, transistor M4, and the current mirror including transistors M1 and M2, and second feedback path F2' formed by transistor M6, transistor M4, and the current mirror including transistors M1 and M3.

Switched current generators I7 and I8 are provided through bipolar NPN transistors Q1 and Q2. The emitter electrodes of transistors Q1 and Q2 are controlled by their respective switches S1 and S2, and a constant current is supplied to the base electrodes of transistors Q1 and Q2. Switch S1 includes a differential pair of P-channel MOS type transistors M7 and M8. The signal UP is supplied to the gate electrode of transistor M7. Since both transistor M7 and transistor M8 are P-channel transistors, the signal UP is inverted before reaching the gate electrode (i.e., it is negated). Switch S2 also includes a differential pair of P-channel MOS type transistors M9 and M10. The signal DOWN, which is also negated like the signal UP, is supplied to the gate electrode of transistor M9. The circuit of FIG. 7 carries out the functions explained above with reference to FIG. 5.

Accordingly, the phase locked loop of the present invention advantageously provides an extremely high resistance to the loop filter. This is obtained by using simple switches that are controlled by signals proportional to the phase displacement received from the phase comparator. The switches take advantage of the fact that a feedback path will maintain a constant common mode voltage to the loop filter terminals and impose equality to the currents integral of fixed generators and switched generators. Thus, the current of constant current generators can be very small while the transistors embodying the generators can be sized for providing an extremely high resistance. Consequently, the problem of a phase offset introduced by the charge pump circuit is substantially removed.

Moreover, sizing is advantageously improved through the use of current mirrors for fixed generators. Current mirrors require MOS transistors with a long narrow channel and thus offer a high resistance. A further advantage of the phase locked loop of the present invention is the use of breaking switches instead of commuting switches. This allows for the switching current generators to be formed of bipolar NPN transistors that are easily obtainable according to BiCMOS technology. This ensures a high level of symmetry between the two differential branches, as well as fast switching of the transistors. Moreover, the circuit is less affected by any change in technological process parameters.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A phase locked loop including a phase comparator, a charge pump circuit, a loop filter having two terminals, and a voltage controlled oscillator, said charge pump circuit comprising:

two symmetric branches each including a constant current generator and a pulsed current generator, one terminal of the loop filter being connected to one of the symmetric branches and the other terminal of the loop filter being connected to the other of the symmetric branches;

feedback paths for controlling the constant current generators based on voltages at the terminals of the loop filter; and circuit breaking switches, each of the circuit breaking switches selectively separating one of the pulsed current generators from the corresponding terminal of the loop filter such that the one pulsed current generator is separated from both terminals of the loop filter, wherein the pulsed current generators supply a first current whose amplitude is proportional to an amplitude of a second current supplied by the constant current generators through the duty cycle of the first current.

2. The phase locked loop as defined in claim 1, wherein the circuit breaking switches are controlled by phase error signals from the phase comparator.

3. A phase locked loop including a phase comparator, a charge pump circuit, a loop filter having two terminals, and a voltage controlled oscillator, said charge pump circuit comprising:

two symmetric branches each including a constant current generator and a pulsed current generator, one terminal of the loop filter being connected to one of the symmetric branches and the other terminal of the loop filter being connected to the other of the symmetric branches;

feedback paths for controlling the constant current generators based on voltages at the terminals of the loop filter; and circuit breaking switches each coupled between one of the pulsed current generators and the corresponding terminal of the loop filter, wherein the pulsed current generators supply a first current whose amplitude is proportional to an amplitude of a second current supplied by the constant current generators through the duty cycle of the first current, and the constant current generators are controlled through a common mode signal drawn by a node of a stage of the voltage controlled oscillator and led to the constant current generators through the feedback paths.

4. The phase locked loop as defined in claim 3, wherein the constant current generators are formed using current mirror circuits.

5. The phase locked loop as defined in claim 4, wherein the feedback paths modulate the current of the current mirror circuits.

6. The phase locked loop as defined in claim 1, wherein the pulsed current generators are formed using bipolar NPN transistors.

7. The phase locked loop as defined in claim 6, wherein the circuit breaking switches are formed using differential MOS transistor pairs.

8. An electronic system including at least one phase locked loop circuit, said phase locked loop circuit comprising:
   a phase comparator;
   a charge pump coupled to the phase comparator;
   a loop filter having two terminals, the loop filter being coupled to the charge pump; and
   a voltage controlled oscillator coupled to the loop filter,
   wherein the charge pump includes:
      two symmetric branches each including a constant current generator and a pulsed current generator, one terminal of the loop filter being connected to one of the symmetric branches and the other terminal of the loop filter being connected to the other of the symmetric branches, the pulsed current generators supplying a first current whose amplitude is proportional to an amplitude of a second current supplied by the constant current generators through the duty cycle of the first current;
      feedback paths for controlling the constant current generators based on voltages at the terminals of the loop filter; and
      circuit breaking switches, each of the circuit breaking switches selectively separating one of the pulsed current generators from the corresponding terminal of the loop filter such that the one pulsed current generator is separated from both terminals of the loop filter.

9. The electronic system as defined in claim 8, wherein the circuit breaking switches are controlled by phase error signals from the phase comparator.

10. The electronic system as defined in claim 8, wherein the constant current generators are controlled through a common mode signal drawn by a node of a stage of the voltage controlled oscillator and led to the constant current generators through the feedback paths.

11. The electronic system as defined in claim 8, wherein the pulsed current generators are formed using bipolar NPN transistors.

12. The electronic system as defined in claim 11, wherein the circuit breaking switches are formed using differential MOS transistor pairs.

13. A charge pump circuit for connection with a loop filter having two terminals, said charge pump circuit comprising:
   two symmetric branches each including a constant current generator and a pulsed current generator, one of the symmetric branches having an interface for connecting with one terminal of the loop filter and the other of the symmetric branches having an interface for connecting with the other terminal of the loop filter;
   feedback paths for controlling the constant current generators based on voltages at the interfaces for the loop filter; and
   circuit breaking switches, each of the circuit breaking switches selectively separating one of the pulsed current generators from the interface for connecting with the corresponding terminal of the loop filter such that the one pulsed current generator is separated from the interfaces for connecting with both terminals of the loop filter,
   wherein the pulsed current generators supply a first current whose amplitude is proportional to an amplitude of a second current supplied by the constant current generators through the duty cycle of the first current.

14. The charge pump circuit as defined in claim 13, wherein the circuit breaking switches are controlled by control signals from a phase comparator.

15. The charge pump circuit as defined in claim 13, wherein the constant current generators are controlled through a common mode signal drawn by a node of a stage of a voltage controlled oscillator and led to the constant current generators through the feedback paths.

16. The charge pump circuit as defined in claim 13, wherein the pulsed current generators are formed using bipolar NPN transistors.

17. The charge pump circuit as defined in claim 16, wherein the circuit breaking switches are formed using differential MOS transistor pairs.

18. A method for controlling a charge pump circuit in a phase locked loop, the phase locked loop having a phase comparator that supplies phase error signals to the charge pump circuit, the charge pump circuit converting the phase error signals into current signals integrated by a loop filter to drive a voltage controlled oscillator, the charge pump circuit having two symmetric branches each including a constant current generator and a pulsed current generator, one terminal of the loop filter being connected to one of the symmetric branches and another terminal of the loop filter being connected to the other of the symmetric branches, said method comprising the steps of:
   controlling the constant current generators through feedback paths that maintain a constant common mode voltage on the two terminals of the loop filter; and
   connecting each pulsed current generator with the corresponding terminal of the loop filter after a transition of a corresponding one of the phase error signals; and
   sizing the constant current generators to supply a first current with a first current amplitude substantially proportional to a second amplitude of a second current that is supplied by the pulsed current generators through the ratio of a period of the phase error signals to a time interval during which each of the phase error signals is active.

19. The method as defined in claim 18, wherein the transition of the corresponding phase error signal is from low logic level to high logic level.

20. The method as defined in claim 18, further comprising the step of interrupting connection of each pulsed current generator with the corresponding terminal of the loop filter during the opposite transition of the corresponding phase signal.

21. The method as defined in claim 20, further comprising the step of forming the constant current generators from current mirror circuits.

22. The phase locked loop as defined in claim 1, wherein neither of the circuit breaking switches operates as part of a communing switch that commutes between the two branches.

23. The phase locked loop as defined in claim 1, wherein the feedback paths maintain a constant common mode voltage on the two terminals of the loop filter.

24. The phase locked loop as defined in claim 1, wherein the constant current generators are sized so as to supply the first current with an amplitude substantially proportional to the amplitude of the second current that is supplied by the pulsed current generators through the ratio of a period of phase error signals from the phase comparator to a time interval during which each of the phase error signals is active.

* * * * *